US012743034B2

(12) United States Patent
Van Gorp et al.

(10) Patent No.: US 12,743,034 B2
(45) Date of Patent: Sep. 22, 2026

(54) METHOD FOR DETERMINING A FOCUS ACTUATION PROFILE FOR ONE OR MORE ACTUATORS OF A LITHOGRAPHIC EXPOSURE APPARATUS

(71) Applicant: ASML NETHERLANDS B.V., Veldhoven (NL)

(72) Inventors: Simon Hendrik Celine Van Gorp, Oud-Turnhout (BE); Stephan Van Reenen, Eindhoven (NL)

(73) Assignee: ASML NETHERLANDS, Veldhoven (NL)

( * ) Notice: Subject to any disclaimer, the term of this patent is extended or adjusted under 35 U.S.C. 154(b) by 514 days.

(21) Appl. No.: 18/270,988

(22) PCT Filed: Dec. 24, 2021

(86) PCT No.: PCT/EP2021/087660
§ 371 (c)(1),
(2) Date: Jul. 5, 2023

(87) PCT Pub. No.: WO2022/161728
PCT Pub. Date: Aug. 4, 2022

(65) Prior Publication Data

US 2024/0061353 A1 Feb. 22, 2024

(30) Foreign Application Priority Data

Jan. 29, 2021 (EP) .................................... 21154359

(51) Int. Cl.
*G03F 7/00* (2006.01)
*G03F 9/00* (2006.01)

(52) U.S. Cl.
CPC ........ *G03F 9/7026* (2013.01); *G03F 7/70641* (2013.01); *G03F 7/706845* (2023.05); *G03F 9/7092* (2013.01)

(58) Field of Classification Search
CPC ............... G03F 9/7026; G03F 7/70641; G03F 7/706845; G03F 9/7092
See application file for complete search history.

(56) References Cited

U.S. PATENT DOCUMENTS 9,735,065 B2 * 8/2017 Hsu ................... H01L 21/32133
11,042,101 B2 * 6/2021 Chen .................. G03F 7/70641
(Continued)

FOREIGN PATENT DOCUMENTS

JP 2020511690 4/2020
WO 2009078708 6/2009
(Continued)

OTHER PUBLICATIONS

International Search Report and Written Opinion issued in corresponding PCT Patent Application No. PCT/EP2021/087660 dated Mar. 29, 2022.

(Continued)

*Primary Examiner* — Hung V Nguyen
(74) *Attorney, Agent, or Firm* — Pillsbury Winthrop Shaw Pittman, LLP426

(57) ABSTRACT

A method for determining a focus actuation profile for one or more actuators of a lithographic exposure apparatus in control of a lithographic exposure process for exposure of an exposure area including at least two topographical levels. The method includes determining a continuous single focus actuation profile for the at least two topographical levels from an objective function including a per-level component operable to optimize a focus metric per topographical level for each of the at least two topographical levels.

20 Claims, 3 Drawing Sheets

(56) References Cited

U.S. PATENT DOCUMENTS

| | | | | |
|---|---|---|---|---|
| 11,422,476 | B2 * | 8/2022 | Schmitt-Weaver | G03F 7/707 |
| 12,416,868 | B2 * | 9/2025 | Van Den Brin | G03F 7/70641 |
| 2006/0033921 | A1 | 2/2006 | Den Boef et al. | |
| 2006/0066855 | A1 | 3/2006 | Boef et al. | |
| 2009/0265679 | A1 | 10/2009 | Brunner et al. | |
| 2010/0201963 | A1 | 8/2010 | Cramer et al. | |
| 2011/0027704 | A1 | 2/2011 | Cramer et al. | |
| 2011/0043791 | A1 | 2/2011 | Smilde et al. | |
| 2011/0102753 | A1 | 5/2011 | Van De Kerkhof et al. | |
| 2012/0044470 | A1 | 2/2012 | Smilde et al. | |
| 2012/0123581 | A1 | 5/2012 | Smilde et al. | |
| 2012/0194792 | A1 | 8/2012 | Sapp et al. | |
| 2013/0258310 | A1 | 10/2013 | Smilde et al. | |
| 2013/0271740 | A1 | 10/2013 | Quintanilha | |
| 2014/0071416 | A1 | 3/2014 | Cho et al. | |
| 2015/0143305 | A1 | 5/2015 | Greco et al. | |
| 2020/0081355 | A1 | 3/2020 | Queens | |
| 2020/0135450 | A1 | 4/2020 | Lee et al. | |
| 2020/0272062 | A1 | 8/2020 | Chen et al. | |

FOREIGN PATENT DOCUMENTS

| | | |
|---|---|---|
| WO | 2009106279 | 9/2009 |
| WO | 2013178422 | 12/2013 |
| WO | 2019185230 | 10/2019 |
| WO | 2021001119 | 1/2021 |

OTHER PUBLICATIONS

Office Action issued in corresponding Japanese Patent Application No. 2023-526020, dated Oct. 7, 2025.

* cited by examiner

METHOD FOR DETERMINING A FOCUS ACTUATION PROFILE FOR ONE OR MORE ACTUATORS OF A LITHOGRAPHIC EXPOSURE APPARATUS

CROSS-REFERENCE TO RELATED APPLICATIONS

This application is the U.S. national phase entry of PCT Patent Application No. PCT/EP2021/087660 which was filed on Dec. 24, 2021, which claims priority of European Patent Application No. 21154359.0 which was filed on Jan. 29, 2021 and which is incorporated herein in its entirety by reference.

FIELD OF THE INVENTION

The present invention relates to methods and apparatus for applying patterns to a substrate in a lithographic process and/or measuring said patterns.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging the patterning device, using projection optics, onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

In performing lithographic processes, such as application of a pattern on a substrate or measurement of such a pattern, process control methods are used to monitor and control the process. Such process control techniques may include focus control (control of the substrate plane with respect to an imaging plane of the projection optics) based on, for example, measured substrate topography and device topography.

SUMMARY OF THE INVENTION

In a first aspect of the invention, there is provided a method for determining a focus actuation profile for one or more actuators of a lithographic exposure apparatus in control of a lithographic exposure process for exposure of an exposure area comprising at least two topographical levels, the method comprising: obtaining topographical data related to the substrate; and determining, based on the topographical data, a continuous single focus actuation profile for the at least two topographical levels from an objective function comprising at least a per-level function component operable to optimize a focus metric per topographical level for each of said at least two topographical levels.

In a second aspect of the invention, there is provided a scanning exposure apparatus comprising a processor operable to perform the method of the first aspect.

In a third aspect of the invention, there is provided a computer program comprising program instructions operable to perform the method of the first or second aspect when run on a suitable apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
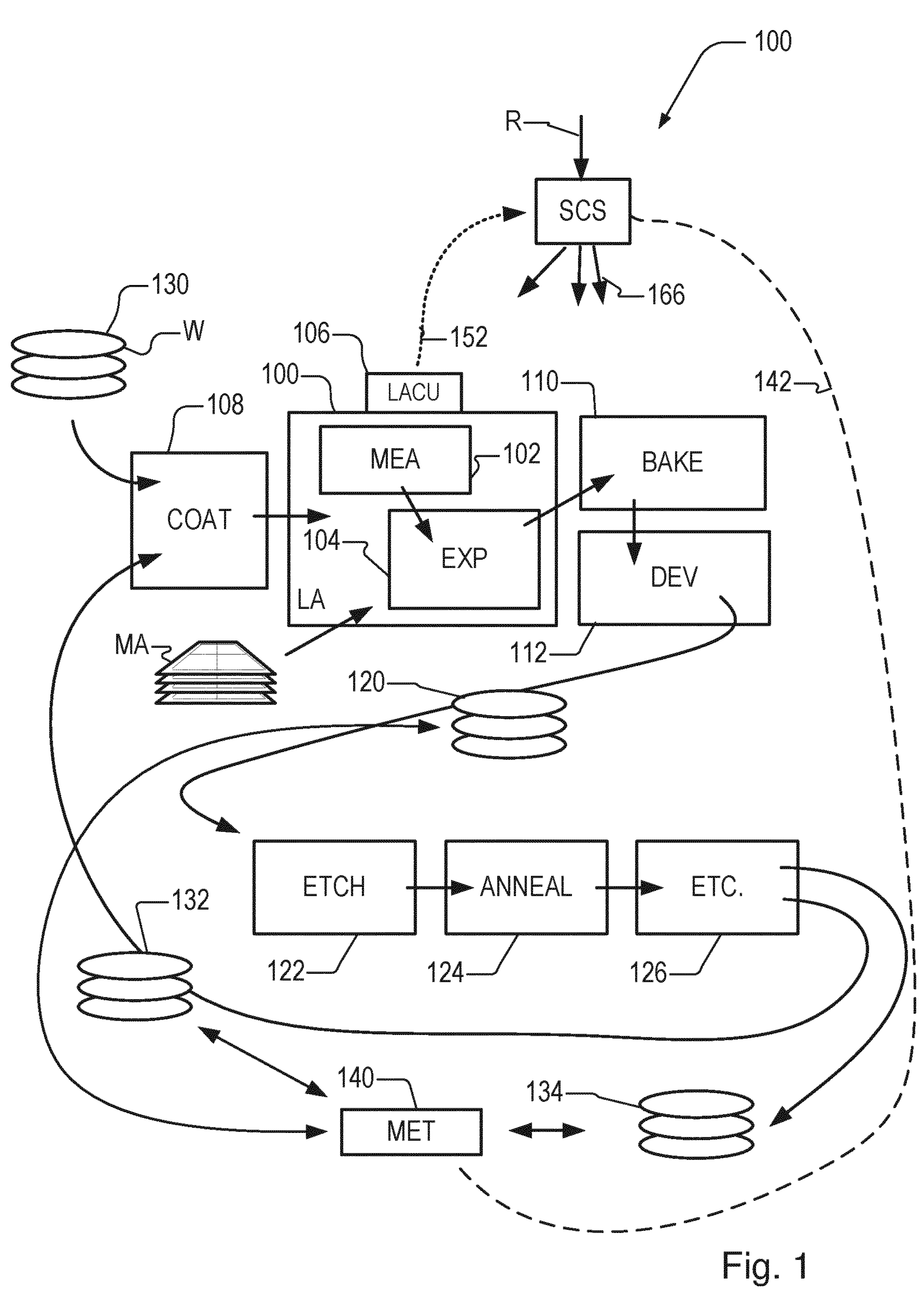
FIG. 1 depicts a lithographic apparatus together with other apparatuses forming a production facility for semiconductor devices.

FIG. 1 at 100 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The projection is performed via a slit scan, where the product pattern is projected on the substrate through a thin exposure slit. This allows adjustment of the position of the patterning device and the substrate to maintain the substrate within an optimal focus window of the slit, accounting for e.g., local height variations. As a result, the defocus may be described in terms of MA and MSD, where MA (moving average) describes the average focus error during passing of slit (observed from fixed point on wafer) and MSD (moving standard deviation) describes the variation of focus error during passing of slit.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. The metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work.

Additionally, metrology apparatus 140 and/or other metrology apparatuses (not shown) can be applied to measure properties of the processed substrates 132, 134, and incoming substrates 130. The metrology apparatus can be used on the processed substrate to determine important parameters such as overlay or CD.

During or before any actual imaging, the processing parameters may have a perturbation that causes them to deviate out of specification (e.g., outside of the process window; i.e., a space of processing parameters under which a pattern will be produced within specification) and thus may lead to defects. For example, the focus may change due to topography of a substrate to be exposed, drift in the substrate stage, deformation of the projection optics, etc.; the dose may change to due drift in the source intensity, dwell time, etc. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the lithographic process are typically based on measurements fed back or fed forward and then modelled using, for example inter-field (across-substrate fingerprint) or intra-field (across-field fingerprint) models. Therefore modelling is typically limited to no better resolution than field fingerprint control, where a typical field may comprise 6 or 8 dies, for example.

The control of the lithographic apparatus may be achieved by modeling a correction profile (e.g., a control profile) for the relevant parameter (or co-optimized for more than one parameter). The modelled correction profile for each parameter is fed into the lithographic apparatus, which actuates the desired correction profile to control the lithographic process (exposure). The control may be based on feed forward models (e.g., from data measured within the lithographic apparatus prior to exposure). The scanner itself has self-correction which needs to be actuated during exposures by the scanner. These self-corrections comprise, for example feed forward models such as reticle heating and wafer heating, machine calibrations such as wafer table shape and layout dependent corrections.

Focus control is an example of a mainly feed forward control loop, based on a large amount of levelling data collected for each substrate which is used to determine corrections for exposure on that substrate which corrects for the surface topography. Other corrections may be based on feedback control loops. Focus control may, in addition to the main feed forward control just mentioned, also have a feedback element based on measurement of focus from exposed structures. Overlay control is typically based on a feedback loop; based on measurement of overlay from processed substrates.

All these sources of corrections are input into the lithographic apparatus, which combines all of the corrections per exposure and actuates them, to optimize overlay, focus, dose and imaging performance. There are a number of methods for the lithographic process to actuate the correction profile e.g., for control of focus/dose and/or overlay. An algorithm, essentially behaving as a filter, transforms the corrections into setpoints for the stages and lens/mirrors. The setpoints are defined as time-dependent trajectories e.g., which define the positioning and tilting of the reticle stage and/or wafer stage relative to each other during exposure. By moving accordingly, the actuators dynamically control focusing and positioning of an image of the reticle onto the substrate. Such methods and others will be readily apparent to the skilled person and will not be discussed further.

Within a die, there may be separate functional areas such as memory areas, logic areas, contact areas etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each of their corresponding best focus settings.

Figure 2:
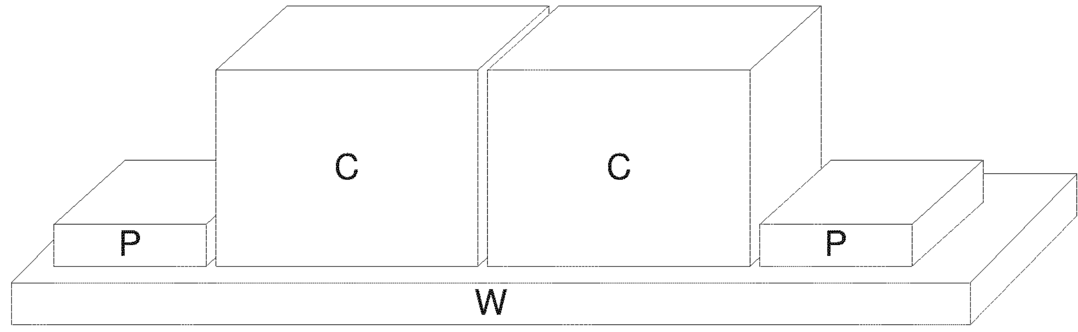
FIG. 2 is a schematic illustration of a portion of a memory IC having a cell/peri architecture.

FIG. 2 illustrates a particular example of different functional area types having different heights. It shows part of a memory type device sometimes referred to as a 3D or vertically integrated memory device. Such a device, on wafer W, is typically divided into two main functional area types: cells C comprising the main memory/storage cells and periphery or peri P comprising the control logic and other control circuitry for the cells. As can be seen, the cell C structure has a surface at a different (height) level than the peri structure P.

Present methods for optimization of focus control for such a cell/peri system (or other multiple level system) is typically based on optimization of imaging device features present at said multiple levels (i.e., the cell level and peri level) in accordance with a single CDU (critical dimension uniformity) objective for all levels. It is however often desirable that the individual CDU's of device features per level is as small as possible, and additionally that the mean focus offset between levels is minimized Presently, there is no explicit method to optimize for this.

Current optimization methods are based on a single level CDU metric, e.g., which follow the height steps as closely as possible to minimize defocus. This tends to result in a large defocus at the top and bottom of the field relative to the mean focus of each level.

As such, there is no explicit method known to optimize for this type of two-level or multi-level system.

Therefore an improved method for focus control is proposed which is not optimized for only a single level of topography, but for multiple topography levels. The proposed method is based on a definition of a cost function. said cost function configured to be used in an optimization problem targeted to derive optimal focus control for the multiple topography levels. In an embodiment, the cost function may be formulated such that it allows the optimization problem to be solved using quadratic programming. In addition, the proposed cost function may optionally include topography-level specific weight factors to take into account different sensitivities to focus error of the respective patterns comprised within the different topography levels. The disclosure will also include a proposed method for solving the optimization problem using the cost function according to a specific embodiment, and its use for deriving an appropriate continuous single focus actuation profile for use in controlling the wafer (and/or reticle) stage during exposure of one or more fields on the substrate.

In an embodiment, a cost function or objective function $f$ is proposed for determining the continuous single focus actuation profile P of a slit projection and an offset per topographical level $LO_{i=1:N}$ for N levels, which minimizes the per topographical level corrected moving average Z (focus) error.

The continuous single focus actuation profile P describes the motion of the slit projection. The slit projection moves with constant velocity in y direction. The degrees of freedom during an exposure scan are the movement of the slit projection in Z (offset in z), Rx (rotation around x axis), and Ry (rotation around y axis). Note that each of these movements is limited in acceleration by hardware constraints.

Figure 3:
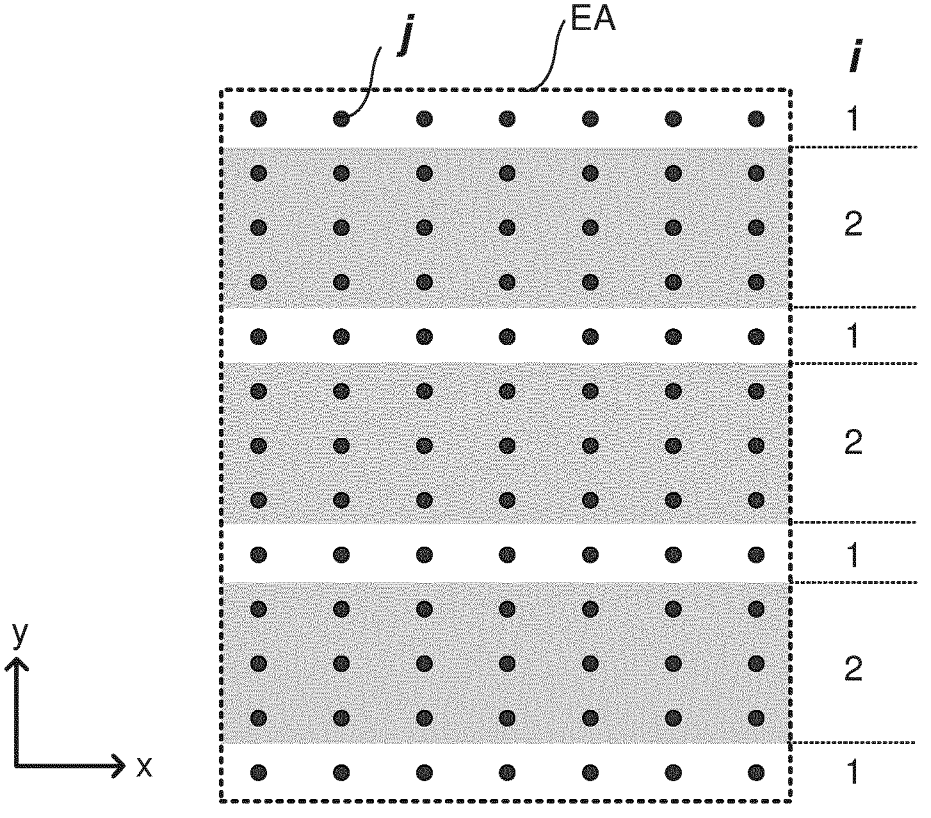
FIG. 3 is a plan view of an exposure area comprising two topographical levels.

In this embodiment, a further degree of freedom is proposed, namely the offset per topographical level i, $LO_{i=1:N}$, which is introduced into the objective function. To illustrate this, FIG. 3 illustrates an example where the full topographical exposure area EA is divided into 2 levels i=1,2. A function lo(j) may be defined to assign an offset $LO_i$ per level to each position j in the area to be exposed:

$$lo(j) = LO_i,\ \text{if}\ j \in \text{ level } i$$

For a two-level example such as illustrated in FIG. 3, this becomes:

$$lo(j) = \begin{cases} LO_1, \text{ if } j \in \text{level } 1 \\ LO_2, \text{ if } j \in \text{level } 2 \end{cases}$$

The method may be based on minimizing the cost function $f(P, LO_{i=1:N})$ by searching an optimum focus actuation profile P and offset per topographical level, $LO_{i=1:N}$. This minimization will be subject to certain actuation constraints on the focus actuation profile P in particular, i.e., with respect to what is physically actuable. These constraints may be implemented in any number of ways. For example, an actuation space may be defined within which the focus actuation profile is to be found. The actuation space may comprise particular actuation limitations (forbidden actions) thereby defining boundaries for the actuation space, and/or candidate/possible focus actuation profiles from which a preferred focus actuation profile is chosen. It is this optimization procedure which determines which focus actuation profile within the actuation space meets an objective corresponding to a criterion applied to the cost function. The cost function may also depend on actual height data and levels (e.g., known and/or as measured), but not as a free parameter.

The cost function may be framed in terms of a per topographical level corrected moving average error function or Z error term, MAerrLevelCorrected, of the slit exposure may be defined as the difference between {the topography Z} and {the moving average height MA(P) of the projection slit minus lo(j)} for any position (j):

$$MAerrLevelCorrected(P, LO_{i=1:N})_j = Z_j - (MA(P)_j - lo(j))$$

Different methods can be considered for aggregating the MAerrLevelCorrected parameter for the whole area exposed by the slit scan. One example may comprises a quadratic summation over each position j:

$$f(P, LO_{i=1:N}) = \sum_j MAerrLevelCorrected(P, LO_{i=1:N})_j^2$$

In optional embodiments, this may be further expanded by any one or more of:

Including weights per topographical area, $W_{LO,i=1:N}$, e.g., to allow imposition of greater weight on topographical areas which are more focus critical:

$$f(P, LO_{i=1:N}) = \sum_j w_{LO}(j) \cdot MAerrLevelCorrected(P, LO_{i=1:N})_j^2$$

Here $w_{LO}$(j) is a function which assigns weights per level i as a function of position j:

$$w_{LO}(j) = W_{LO,i}, \text{ if } j \in \text{ level } i$$

Including a Moving Standard Deviation term, MSD, to include the impact of fading in the cost function. Additionally an MA/MSD weighting $W_1$, $W_2$ may be included to allow trade-off between MAerr and MSD:

$$f(P, LO_{i=1:N}) = \sum_j w_{LO}(j) \cdot (W_1 \cdot MAerrLevelCorrected(P, LO_{i=1:N})_j^2 + W_2 \cdot MSD(P)_j^2)$$

Including an offset minimization term, i.e., the area offset per topographical level to additionally minimize the offset $LO_{i=1:N}$ itself. This offset term describes the mean MA error difference between different levels, it may be desirable to minimize this as too greater step may be difficult to actuate. One or more weight factors $W_3 \cdot W_{LO,i}$ may be included to enable trade-off with the other terms in the objective function:

$$f(P, LO_{i=1:N}) = \sum_i W_3 \cdot W_{LO,i} \cdot LO_i^2 + \sum_j w_{LO}(j) \cdot (W_1 \cdot MAerrLevelCorrected(P, LO_{i=1:N})_j^2 + W_2 \cdot MSD(P)_j^2)$$

Another methods for aggregating per position j may comprise, for example:

Sum of the absolute value of MAerr corrected per level:

$$f(P, LO_{i=1:N}) = \sum_j |MAerrLevelCorrected(P, LO_{i=1:N})_j|$$

Sum of cubic MAerr corrected per level:

$$f(P, LO_{i=1:N}) = \sum_j MAerrLevelCorrected(P, LO_{i=1:N})_j^3$$

In addition, these examples may be further expanded to minimize the max absolute defocus (MAerr) per die (k=1: NumDies) per level (i=1:N):

$$f(P, LO_{i=1:N}) = \sum_k \sum_i \max(|MAerrLevelCorrected(P, LO_i)_j|)$$

$$\text{with } j \in \text{ level } i$$

Below is an example method to solve the above problem, simplified by using weights for the different terms set to 1:

$$f(P, LO_{i=1:N}) = \sum_i LO_i^2 + \sum_j (MAerrLevelCorrected(P, LO_{i=1:N})_j^2 + MSD(P)_j^2)$$

The above problem can be solved using quadratic programming after rewriting the cost function in the form:

$$-0.5 * x' * H * x + f' * x + g$$

where the prime denotes the transpose matrix. The objective of the solver is to find x which minimizes the cost function.

A basic implementation of the minimization of above defined cost function may be represented as:

$$\text{minimize } \sum_i LO_i^2 + MAerrLevelCorrected^2 + MSD^2$$

Substituting for MAerrlevelcorrected, the difference between Z (height at each grid point of a control grid) and the moving average (MA) of the slit, including the offset per level ($LO_i$), gives:

$$(Z - (MA - lo))^2 + \sum_i LO_i^2 + MSD^2 = Z^2 - 2 * Z * (MA - lo) + (MA - loLO_i)^2 + \sum_i LO_i^2 + MSD^2$$

x may be defined as an array holding the exposure profile spline coefficients c(1:M) as well as the offset per level (e.g., 2 in total for this specific example):

$$x = \begin{bmatrix} x_{MA} \\ x_{LO} \end{bmatrix} = \begin{bmatrix} c_1 \\ \vdots \\ c_M \\ LO_1 \\ LO_2 \end{bmatrix}$$

Now H, $f$ and g can be defined as:

$$g = Z' * I * Z$$

$$f = -2 * Z' * I * M$$

$$H = 2 * (M_1' * I * M_1 + M_2' * I * M_2)$$

where I is an identity matrix (this may be replaced by a weighting matrix when weights are applied as has been described).

$M_1$ is a matrix comprising terms related to defocus per grid point:

$$M_1 = \begin{bmatrix} M_{MA} & M_{LO} \\ 0 & I \end{bmatrix}$$

$M_{MA}$ describes the average instantaneous defocus over the exposure slit (taking slit intensity into account). $M_{LO}$ essentially assigns a level offset (see $x_{LO}$) per grid point.

$M_2$ is a matrix comprising terms related to MSD per grid point and zeros related to the level offsets (as no level offset is applied to MSD):

$$M_2 = \begin{bmatrix} M_{MSD} & 0 & 0 \\ 0 & 0 & 0 \\ 0 & 0 & 0 \end{bmatrix}$$

Where $M_{MSD}$ is a matrix:

$$M_{MF}' * I * M_{MF} - M_{MA}' * I * M_{MA}$$

where $M_{MF}$ comprises the average instantaneous defocus over the exposure slit per grid point multiplied by the square root of the slit intensity.

Note that matrix Z should be extended with zeros for each level:

$$Z = \begin{bmatrix} Z_{per\ gridpoint} \\ 0 \\ 0 \end{bmatrix}$$

It should be appreciated that quadratic programming are not required but may be used to simplify processing. The cost function may be solved by any suitable minimization such as any of the examples described.

The above equations do not explicitly specify normalizations of e.g., the weights.

Boundary conditions can also be added to this cost function.

Figure 4:
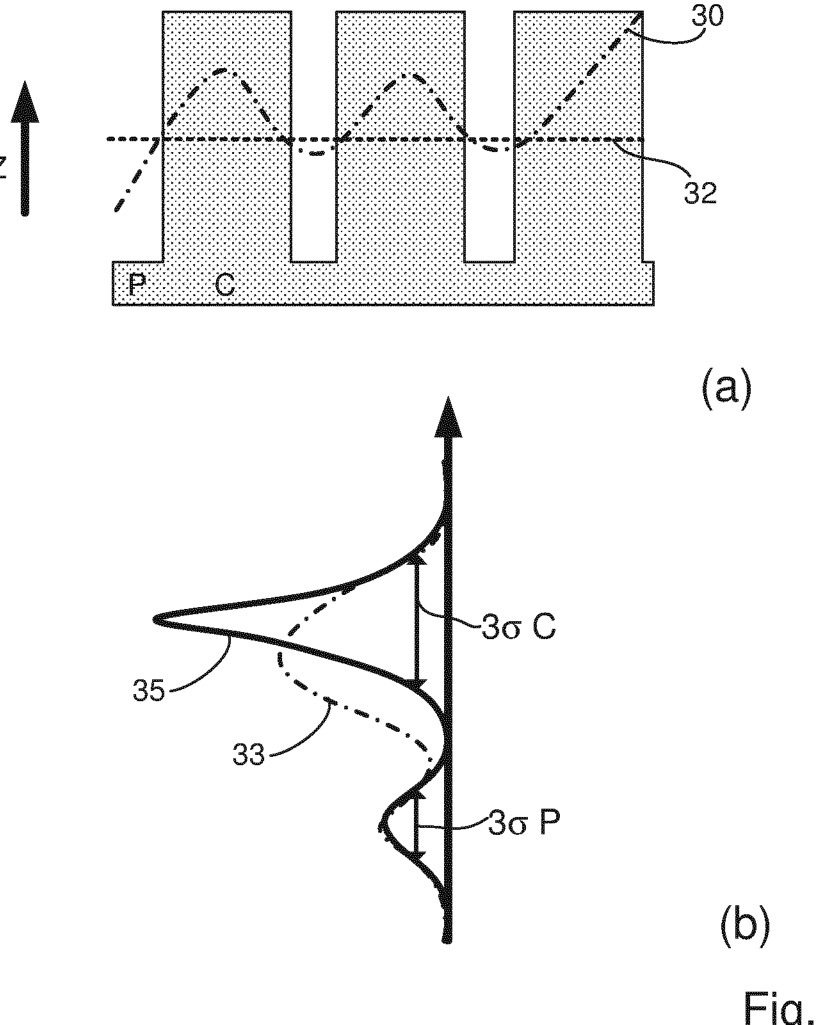
FIG. 4(*a*) is a plot of focus control trajectories for three different control strategies, and 4(*b*) a plot of the defocus distribution for these three control strategies.

FIG. 4(*a*) is a plot of a focus error associated with each of three alternative focus actuation profiles (control trajectories in Z (i.e., focus control trajectories)) with the topography (cells C and peri P) shaded behind for reference. The first focus actuation profile 30 corresponds to a cost function associated with a single CDU metric; a large shift, corresponding to a large defocus, at the end of the field is evident. The second focus actuation profile 32 corresponds to the multiple level (specifically here, two level) optimization disclosed herein. This solution shows good focus performance: there is no significantly different focus error between the individual levels and the focus error is constant across each of said individual levels. The result of this focus performance is that CDU across the individual levels and also between the individual levels is improved.

FIG. 4(*b*) is a plot of the (de)focus distribution for each level. For each of the peaks, the width distribution corresponds to MSD and the center position of the peaks correspond to MA First plot 33 corresponds to the focus actuation profile in case of a single CDU optimization scenario. Focus variation (MSD) performance in terms of cell 3σ, peri 3σ, combined cell and peri 3σ are all poor for this strategy. Second plot 35 corresponds to the use of a focus actuation profile corresponding to the cos function as proposed in this disclosure. Cell 3σ, peri 3σ, combined cell and peri 3σ and focus (MSD) performance are all good (and improved with respect to the single level optimization) for this strategy. More specifically, there is a narrower distribution focus variation error for cell C, and acceptable broadening peak for peri P.

Further embodiments of the disclosure are summarized in the list of numbered clauses below:

1. A method for determining a focus actuation profile for one or more actuators of a lithographic exposure apparatus in control of a lithographic exposure process for exposure of an exposure area comprising at least two topographical levels, the method comprising:

obtaining topographical data related to the substrate; and determining, based on the topographical data, a continuous single focus actuation profile for the at least two topographical levels from an objective function comprising at least a per-level function component operable to optimize a focus metric per topographical level.

2. A method according to clause 1, wherein the continuous single focus optimization profile comprises a profile of an exposure slit projection for performing the lithographic exposure process.

3. A method according to clause 1 or 2, wherein said determining step comprises minimizing the objective function in terms of the continuous single focus actuation profile and the per-level function component.

4. A method according to clause 3, wherein said per-level function component comprises a per-level offset function component and said minimizing the objective function in terms of the per-level offset function component yields a per-level focus offset per topographical level.

5. A method according to clause 4, wherein said minimizing an objective function comprises minimizing a per-level corrected moving average error over a plurality of positions within an exposure area.

6. A method according to clause 5, wherein the per-level corrected moving average error comprises a difference between:

a topographical value per position comprised within the topographical data, and a moving average height of the exposure slit less said per-level focus offset per position.

7. A method according to clause 5 or 6, comprising aggregating the per-level corrected moving average error over said exposure area.

8. A method according to clause 7, wherein said aggregating comprises a summation or quadratic summation of the per-level corrected moving average error over each position.

9. A method according to clause 7 or 8, wherein the objective function comprises weights per topographical level which accounts for different sensitivities to focus error of respective patterns comprised within the different topographical levels.

10. A method according to any of clauses 7 to 9, wherein the objective function comprises a moving standard deviation term for minimizing the variation of focus error during passing of an projection for performing the lithographic exposure process.

11. A method according to clause 10, comprising a weighting for one or both of the moving standard deviation term and the per-level corrected moving average error to control balancing of these terms.

12. A method according to clause 10 or 11, wherein the moving standard deviation term comprises a per-level moving standard deviation term.

13. A method according to clause 11 or 12, wherein the moving standard deviation term comprise an across-level moving standard deviation term.

14. A method according to any of clauses 4 to 13, wherein the objective function comprises an offset minimization term for minimization of differences between said per-level focus offsets.

15. A method according to clause 7, wherein said aggregating comprises:

a sum of the absolute value of the per-level corrected moving average error over each position; or a sum of the cube of the per-level corrected moving average error over each position.

16. A method according to clause 15, wherein the determining step comprises minimize the max absolute per-level corrected moving average error per die.

17. A method according to any preceding clause, wherein the objective function is solved via applying quadratic programming techniques to reformulate the objective function.

18. A method according to any preceding clause, wherein boundary conditions are applied to the objective function.

19. A method according to any preceding clause, wherein the topographical levels comprise a first topographical level relating to memory cell regions and a second topographical level relating to peripheral logic regions.

20. A method according to any preceding clause, comprising performing a lithographic exposure using the continuous single focus actuation profile defined in any preceding clause.

21. A method according to any preceding clause, wherein said continuous single focus actuation profile defines setpoints over time for one or more actuators which actuate the lithographic exposure process.

22. A scanning exposure apparatus comprising a processor operable to perform the method of any of clauses 1 to 21.

23. A scanning exposure apparatus according to clause 22, further comprising:

an illumination source for providing exposure illumination;

a reticle stage for holding a patterning device which patterns said exposure illumination; and a substrate stage for holding the substrate, wherein said focus continuous single actuation profile is used to control said substrate stage and/or said reticle stage with respect to each other.

24. A computer program comprising program instructions operable to perform the method of any of clauses 1 to 21 when run on a suitable apparatus.

25. A non-transient computer program carrier comprising the computer program of clause 24.

26. A method for determining a focus actuation profile for one or more actuators of a lithographic exposure apparatus in control of a lithographic exposure process for exposure of an exposure area comprising at least two topographical levels, the method comprising:

obtaining topographical data related to the substrate; and determining, based on the topographical data, a continuous single focus actuation profile for the at least two topographical levels from an objective function comprising at least a per-level function component operable to optimize a focus metric per topographical level for each of said at least two topographical levels.

Although patterning devices in the form of a physical reticle have been described, the term "patterning device" in this application also includes a data product conveying a pattern in digital form, for example to be used in conjunction with a programmable patterning device.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for determining a focus actuation profile for one or more actuators of a lithographic exposure apparatus in control of a lithographic exposure process for exposure of an area comprising at least two topographical levels, the method comprising:

obtaining topographical data related to a substrate; and determining, based on the topographical data and by a processor, a continuous single focus actuation profile for the at least two topographical levels from an objective function comprising at least a per-topographical-level function component operable to optimize a focus metric per topographical level for each of the at least two topographical levels.

2. The method as claimed in claim 1, wherein the continuous single focus optimization profile comprises a profile of an exposure slit projection for performing the lithographic exposure process.

3. The method as claimed in claim 1, wherein the determining comprises minimizing the objective function in terms of the continuous single focus actuation profile and the per-topographical-level function component.

4. The method as claimed in claim 3, wherein the per-topographical-level function component comprises a per-topographical-level offset function component and the minimizing the objective function in terms of the per-topographical-level offset function component yields a per-topographical-level focus offset per topographical level.

5. The method as claimed in claim 4, wherein the minimizing an objective function comprises minimizing a per-topographical-level corrected moving average error over a plurality of positions within an exposure area.

6. The method as claimed in claim 5, wherein the per-topographical-level corrected moving average error comprises a difference between:

a topographical value per position comprised within the topographical data, and a moving average height of an exposure slit less the per-topographical-level focus offset per position.

7. The method as claimed in claim 5, further comprising aggregating the per-topographical-level corrected moving average error over the exposure area.

8. The method as claimed in claim 7, wherein the aggregating comprises a summation or quadratic summation of the per-topographical-level corrected moving average error over each position.

9. The method as claimed in claim 7, wherein the objective function comprises weights per topographical level which accounts for different sensitivities to focus error of a respective pattern comprised within the different topographical levels.

10. The method as claimed in claim 7, wherein the objective function comprises a moving standard deviation term for minimizing variation of focus error during passing of an exposure slit across the exposure area while performing the lithographic exposure process.

11. The method as claimed in claim 10, further comprising a weighting for one or both of the moving standard deviation term and the per-topographical-level corrected moving average error to control balancing of these terms.

12. The method as claimed in claim 11, wherein the moving standard deviation term comprises an across-level moving standard deviation term.

13. The method as claimed in claim 4, wherein the objective function comprises an offset minimization term for minimization of differences between the per-topographical-level focus offsets.

14. The method as claimed in claim 7, wherein the aggregating comprises:

a sum of the absolute value of the per-topographical-level corrected moving average error over each position; or a sum of the cube of the per-topographical-level corrected moving average error over each position.

15. The method as claimed in claim 14, wherein the determining comprises minimization of the maximum absolute per-topographical-level corrected moving average error per die.

16. The method as claimed in claim 1, wherein the objective function is solved via applying quadratic programming techniques to reformulate the objective function.

17. The method as claimed in claim 1, wherein boundary conditions are applied to the objective function.

18. The method as claimed in claim 1, wherein the topographical levels comprise a first topographical level relating to a memory cell region and a second topographical level relating to a peripheral logic region.

19. The method as claimed in claim 1, comprising performing a lithographic exposure using the continuous single focus actuation profile.

20. A non-transitory computer-readable medium having instructions therein configured to, upon execution by at least one processor, cause the at least one processor to at least:

obtain topographical data related to a substrate; and determine, based on the topographical data, a continuous single focus actuation profile for one or more actuators of a lithographic exposure apparatus in control of a lithographic exposure process for exposure of an area comprising at least two topographical levels, the determination including determination of the continuous single focus actuation profile for the at least two topographical levels from an objective function comprising at least a per-topographical-level function component operable to optimize a focus metric per topographical level for each of the at least two topographical levels.

* * * * *